United States Patent
Steurer et al.

(10) Patent No.: US 11,424,093 B2
(45) Date of Patent: Aug. 23, 2022

(54) DIRECT CURRENT HYBRID CIRCUIT BREAKER WITH REVERSE BIASED VOLTAGE SOURCE

(71) Applicant: The Florida State University Research Foundation, Inc., Tallahassee, FL (US)

(72) Inventors: Michael Steurer, Tallahassee, FL (US); Fang Peng, Tallahassee, FL (US)

(73) Assignee: The Florida State University Research Foundation, Inc., Tallahassee, FL (US)

( * ) Notice: Subject to any disclaimer, the term of this patent is extended or adjusted under 35 U.S.C. 154(b) by 221 days.

(21) Appl. No.: 16/663,012

(22) Filed: Oct. 24, 2019

(65) Prior Publication Data

US 2020/0135420 A1    Apr. 30, 2020

Related U.S. Application Data

(60) Provisional application No. 62/750,219, filed on Oct. 24, 2018.

(51) Int. Cl.
  *H01H 33/59*  (2006.01)
  *H01H 9/54*  (2006.01)
  (Continued)

(52) U.S. Cl.
  CPC ........ *H01H 33/596* (2013.01); *H01H 3/0213* (2013.01); *H01H 9/541* (2013.01);
  (Continued)

(58) Field of Classification Search
  CPC ....... H01H 2009/544; H01H 2009/546; H01H 3/0213; H01H 33/596; H01H 89/00;
  (Continued)

(56) References Cited

U.S. PATENT DOCUMENTS 3,532,844 A    10/1970  Gwyn
6,028,471 A     2/2000  Koyama et al.
(Continued)

FOREIGN PATENT DOCUMENTS

WO    2014048483    4/2014
WO    2015112796    7/2015
WO    2017194471    11/2017

OTHER PUBLICATIONS

Shukla, et al., "A Survey on Hybrid Circuit-Breaker Topologies", IEEE Transactions on Power Delivery, vol. 30, No. 2, Apr. 2015, 627-641.

*Primary Examiner* — Jared Fureman
*Assistant Examiner* — Nicolas Bellido
(74) *Attorney, Agent, or Firm* — Meunier Carlin & Curfman LLC

(57) ABSTRACT

Within a direct current hybrid circuit breaker (DC HCB), a commutation unit (CU) is provided in a semiconductor switch path in series with a semiconductor switch to facilitate opening the DC HCB. The semiconductor switch path is connected in parallel with a mechanical switch path that includes a mechanical switch. The CU is a controlled voltage source which applies a reverse biased voltage on the semiconductor switch path. The CU causes the current through the mechanical switch to ramp down while the current through the semiconductor switch ramps up to a supply current. The CU maintains the current through the mechanical switch to remain at a zero vale by compensating for the voltage drop across the semiconductor switch and the self-inductance of the semiconductor switch path. The mechanical switch can open without current and against no recovery voltage.

18 Claims, 9 Drawing Sheets

(51) Int. Cl.
*H02H 3/087* (2006.01)
*H03K 17/0814* (2006.01)
*H01H 3/02* (2006.01)
*H02H 3/02* (2006.01)

(52) U.S. Cl.
CPC ............ *H02H 3/023* (2013.01); *H02H 3/087* (2013.01); *H03K 17/08144* (2013.01); *H01H 2009/544* (2013.01); *H01H 2009/546* (2013.01)

(58) Field of Classification Search
CPC ...... H01H 9/541; H02H 1/0007; H02H 3/023; H02H 3/087; H02H 9/04; H03K 17/08144; H03K 2017/515
See application file for complete search history.

(56) References Cited

U.S. PATENT DOCUMENTS

| | | | |
|---|---|---|---|
| 6,501,635 B1 | 12/2002 | Frohlich et al. | |
| 6,535,366 B1 | 3/2003 | Frohlich et al. | |
| 6,636,134 B2 | 10/2003 | Froehlich et al. | |
| 7,508,636 B2 | 3/2009 | Sellier et al. | |
| 8,258,632 B1 | 9/2012 | Sullivan et al. | |
| 8,810,985 B2 | 8/2014 | Demetriades et al. | |
| 8,891,209 B2 | 11/2014 | Häfner et al. | |
| 9,947,496 B2 | 4/2018 | Niehoff | |
| 2012/0218676 A1 | 8/2012 | Demetriades et al. | |
| 2015/0280417 A1* | 10/2015 | Shen | H02H 3/087 361/100 |
| 2016/0204595 A1* | 7/2016 | Park | H02H 3/087 361/10 |
| 2016/0301200 A1* | 10/2016 | Niehoff | H02H 3/021 |
| 2016/0301204 A1* | 10/2016 | Niehoff | H02H 1/06 |
| 2016/0314928 A1* | 10/2016 | Niehoff | H01H 83/04 |
| 2016/0322178 A1* | 11/2016 | Park | H01H 33/596 |
| 2016/0329179 A1* | 11/2016 | Kim | H01H 9/547 |
| 2017/0040999 A1* | 2/2017 | Schneider | H03K 17/72 |
| 2017/0163023 A1* | 6/2017 | Niehoff | H02H 3/08 |
| 2018/0091137 A1* | 3/2018 | Schneider | H02M 7/515 |
| 2021/0367422 A1* | 11/2021 | Li | H02H 3/087 |

* cited by examiner

DIRECT CURRENT HYBRID CIRCUIT BREAKER WITH REVERSE BIASED VOLTAGE SOURCE

CROSS-REFERENCE TO RELATED APPLICATIONS

This application claims the benefit of priority to U.S. Provisional Application No. 62/750,219, filed Oct. 24, 2018, the disclosure of which is incorporated by reference in its entirety.

BACKGROUND

High voltage direct current hybrid circuit breakers are typically based on a first current path with a main semiconductor switch connected in parallel to a second current path with an auxiliary semiconductor switch connected in series with a mechanical switch. The principal of operation of a hybrid circuit breaker is that the auxiliary semiconductor switch and the mechanical switch are closed during normal operation. Upon detection of an overcurrent condition, the hybrid circuit breaker attempts to break the current flowing through it by first closing the main semiconductor switch and opening the auxiliary semiconductor to commutate the current flowing through the second current path to the first current path. When the current on the second current path is held at zero value for a predetermined period of time, the mechanical switch is opened to create an open circuit condition on the second current path. Once the mechanical switch is opened, the main semiconductor switch is opened, resulting in a commutation of the current from the main semiconductor switch to a surge arrester, such as a varistor, connected in parallel to the main semiconductor switch. However, providing the auxiliary semiconductor switch in series with the mechanical switch results in on-state losses across the auxiliary semiconductor switch in addition to on-state losses across the mechanical switch.

Hybrid circuit breakers which do not rely on the auxiliary semiconductor switch typically rely on introducing an air gap in the mechanical switch to induce an arc voltage in the mechanical switch, which commutes the current from the second current path to the first current path. However, creating an arc in the mechanical switch increases wear on the mechanical switch, introduces additional heat dissipation requirements, and results in a slower acting mechanical switch (e.g., the mechanical switch takes longer to withstand voltage in the open position).

SUMMARY

In a first aspect of the disclosure, a direct current (DC) hybrid circuit breaker (HCB), comprises an input, an output, a mechanical switch path, and a semiconductor switch path. The mechanical switch path comprises a mechanical switch and is coupled between the input and the output. The semiconductor switch path comprises a semiconductor switch connected in series with a commutation unit configured to supply a reverse biased voltage source on the semiconductor switch path. The semiconductor switch path is coupled between the input and the output in parallel to the mechanical switch path.

In some implementations of the first aspect of the disclosure, the DC HCB further comprises a surge arrestor path comprising a surge arrestor. The surge arrestor path is coupled between the input and the output in parallel to the mechanical switch path and the semiconductor switch path or the surge arrestor path is coupled in parallel across the semiconductor switch.

In some implementations of the first aspect of the disclosure, the surge arrestor is configured to absorb residual fault currents in the DC HBC upon the mechanical switch and the semiconductor switch being opened.

In some implementations of the first aspect of the disclosure, the DC HCB further comprises a second surge arrestor coupled in parallel across the semiconductor switch, the commutation unit, or both the semiconductor switch and the commutation unit.

In some implementations of the first aspect of the disclosure, the second surge arrestor is coupled in parallel across the commutation unit. The DC HCB further comprises a third surge arrestor coupled in parallel across the semiconductor switch.

In some implementations of the first aspect of the disclosure, the second surge arrestor is included in the semiconductor switch path.

In some implementations of the first aspect of the disclosure, the surge arrestor is configured to protect the commutation unit from an over-voltage condition.

In some implementations of the first aspect of the disclosure, the surge arrestor or the second surge arrestor is a varistor, metal oxide varistor, thyristor, or any other voltage clamping circuit.

In some implementations of the first aspect of the disclosure, the commutation unit comprises a capacitor, an input of the commutation unit, an output of the commutation unit, a first switch, and a second switch. The input of the commutation unit is coupled to a negative terminal of the capacitor. A first side of the first switch is coupled to a positive terminal of the capacitor. A first side of the second switch is coupled to a second side of the first switch and is coupled to the output of the commutation unit. A second side of the second switch is coupled to the input of the commutation unit and the negative terminal of the capacitor.

In some implementations of the first aspect of the disclosure, the commutation unit comprises a capacitor, an input of the commutation unit, an output of the commutation unit, a first switch, a second switch, a third switch, and a fourth switch. A first side of the first switch is coupled to a positive terminal of the capacitor. A first side of the second switch is coupled to a second side of the first switch and the output of the commutation unit. A second side of the second switch is coupled to a negative terminal of the capacitor. A first side of the third switch is coupled to the positive terminal of the capacitor and the first side of the first switch. A first side of the fourth switch is coupled to a second side of the third switch and the input of the commutation unit. A second side of the fourth switch is coupled to the negative terminal of the capacitor and the second side of the second switch.

In some implementations of the first aspect of the disclosure, the commutation unit comprises transformer and an inverter connected in parallel with a capacitor.

In some implementations of the first aspect of the disclosure, the commutation unit comprises a capacitor, an input of the commutation unit, an output of the commutation unit, and a first switch. A first side of the first switch is coupled to a positive terminal of the capacitor. In some implementations, the input of the commutation unit is coupled to a negative terminal of the capacitor and a second side of the first switch is coupled to the output of the commutation unit. In some implementations, the second side of the first switch is coupled to a first side of a first winding of the transformer, a second side of the first winding of the transformer is coupled to a negative terminal of the capacitor, the output of the commutation unit is coupled to the first side of a second winding of the transformer, and the input of the commutation unit is coupled to the second side of the second winding of the transformer.

In a second aspect of the disclosure, a method of operating a direct current (DC) hybrid circuit breaker (HCB) comprises detecting an over-current condition in a switch current across a closed mechanical switch in a mechanical switch path of the DC HCB. In response to detecting the over-current condition, closing a semiconductor switch and providing a reverse biased commutation voltage by a commutation unit. The semiconductor switch and the commutation unit are connected in series across a semiconductor switch path of the DC HCB and the semiconductor switch path is coupled in parallel to the mechanical switch path. The method further comprises detecting that the switch current reaches a zero-current condition and responsively opening the mechanical switch.

In some implementations of the second aspect of the disclosure, the method further comprises maintaining the zero-current condition in the switch current for a predetermined period of time.

In some implementations of the second aspect of the disclosure, the method further comprises opening the semiconductor switch and turning off the commutation unit after the predetermined period of time.

In some implementations of the second aspect of the disclosure, the commutation unit comprises a capacitor, a first switch, and a second switch. The first switch is coupled between a positive terminal of the capacitor and a positive terminal of the commutation unit. The second switch is coupled between the positive terminal of the commutation unit and a negative terminal of the commutation unit. A negative terminal of the capacitor is coupled to the negative terminal of the commutation unit. In some implementations of the second aspect of the disclosure, providing a reverse biased commutation voltage by the commutation unit comprises closing the first switch and opening the second switch. In some implementations of the second aspect of the disclosure, maintaining the zero-current condition in the switch current comprises repeatedly toggling the first switch and the second switch to maintain the switch current between an upper limit current and a lower limit current.

These and other features will be more clearly understood from the following detailed description taken in conjunction with the accompanying drawings and claims.

BRIEF DESCRIPTION OF THE DRAWINGS

For a more complete understanding of the present disclosure, reference is now made to the following brief description, taken in connection with the accompanying drawings and detailed description, wherein like reference numerals represent like parts.

DETAILED DESCRIPTION

Figure 1A:
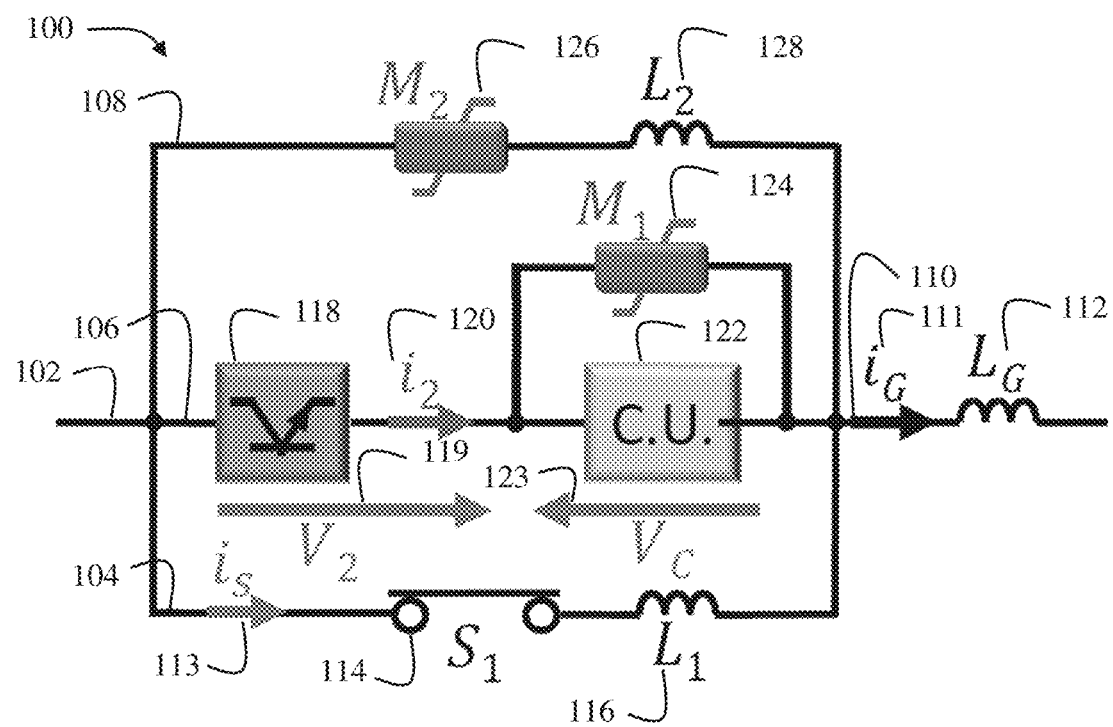
FIGS. 1A-1C are circuit block diagrams of a direct current (DC) hybrid circuit breaker (HCB) suitable for implementing the several embodiments of the disclosure.

It should be understood at the outset that although illustrative implementations of one or more embodiments are illustrated below, the disclosed systems and methods may be implemented using any number of techniques, whether currently known or in existence. The disclosure should in no way be limited to the illustrative implementations, drawings, and techniques illustrated below, but may be modified within the scope of the appended claims along with their full scope of equivalents. Use of the phrase "and/or" indicates that any one or any combination of a list of options can be used. For example, "A, B, and/or C" means "A", or "B", or "C", or "A and B", or "A and C", or "B and C", or "A and B and C".

Within a direct current hybrid circuit breaker (DC HCB), a commutation unit (CU) is provided in a semiconductor switch path in series with a semiconductor switch to facilitate opening the DC HCB. The semiconductor switch path is connected in parallel with a mechanical switch path that includes a mechanical switch. The CU is a controlled voltage source which applies a reverse biased voltage on the semiconductor switch path. The CU allows for the buildup of a commutation voltage which, across the loop inductance of the mechanical switch path, causes the current through the mechanical switch to ramp down while the current through the semiconductor switch ramps up to a supply current. The CU maintains the current through the mechanical switch to remain at a zero vale by compensating for the voltage drop across the semiconductor switch and the self-inductance of the semiconductor switch path. Because the current, and therefore the voltage, across the mechanical switch is maintained at a zero value, the mechanical switch can open without current and against no recovery voltage. Once the mechanical switch is opened, the semiconductor switch opens and commutes the current to a surge arrester path. The surge arrester path includes a surge arrestor, such as a varistor, that operates to reduce the remaining current in the HCB to zero.

Likewise, the CU in the semiconductor switch path facilitates closing the DC HCB. To close the DC HCB, the semiconductor switch and the mechanical switch are simultaneously closed to allow current to build up in a load circuit. While the current is building up in the load circuit, the CU compensates for the voltage drop across the semiconductor switch and any self-inductance of the semiconductor switch path to maintain a zero current value across the mechanical switch. Once the mechanical switch is fully closed, the semiconductor switch opens which commutates the current into the mechanical switch path.

By locating the CU in the semiconductor switch path, the CU does not contribute to the on-state losses for the DC HCB. Additionally, by locating CU in the semiconductor switch path, the only component in the mechanical switch path is the mechanical switch itself. Because the mechanical switch is the only component in the mechanical switch path, the on-state losses for the DC HCB are limited to the loss across the mechanical switch, which are typically very low. Additionally, by providing a reverse biased voltage source CU in the semiconductor switch path, no arc voltage is needed to be generated by the mechanical switch.

FIG. 1 is a circuit block diagram of a direct current (DC) hybrid circuit breaker (HCB) 100 suitable for implementing the several embodiments of the disclosure. The HCB 100 comprises an input path 102, a mechanical switch path 104, a semiconductor switch path 106, a surge arrester path 108, and an output path 110. Each of the mechanical switch path 104, the semiconductor switch path 106, and the surge arrester path 108 are connected to each other in parallel between the input path 102 and the output path 110. The input path 102 supplies a current from a current source (not shown) to the HCB 100. The output path 110 supplies an output current 111, shown as ic, from the input path 102 to a load circuit 112, modeled as an inductive load in the example of FIG. 1. In some implementations, the output current 111 is a grid current for supplying a DC power grid.

The mechanical switch path 104 comprises a mechanical switch 114. In some implementations, the mechanical switch 114 is the only component in the mechanical switch path 104. The mechanical switch 114 is shown in FIG. 1 in a closed position for supplying a switch current 113, shown as $i_s$, from the input path 102 to the output path 110. An inductor 116 is shown in the mechanical switch path 104 to model the combined parasitic inductance in the loop of the mechanical switch path 104 and the semiconductor switch path 106, though an inductor itself is not located in the mechanical switch path 104.

The semiconductor switch path 106 comprises a semiconductor switch 118 connected in series with a commutation unit (CU) 122. The CU 122 is a controlled voltage source which applies a reverse biased voltage on the semiconductor switch path 106. The CU 122 allows for the buildup of a commutation voltage 123, shown as $V_C$, which, across the loop inductance 116 of the mechanical switch path 104, causes the switch current 113 through the mechanical switch to ramp down while a commutation current 120, shown as $i_2$, through the semiconductor switch 118 ramps up to the output current 110. Therefore, the semiconductor switch 118 in a closed state supplies the commutation current 120 from the input path 102 to the output path 110. The semiconductor switch 118 causes a voltage drop 119, shown as $V_2$, in a direction of the commutation current 120. Therefore, the reverse biased commutation voltage 123 supplied by the CU 122 is biased in a direction opposed to the voltage drop 119 across the semiconductor switch 118.

Figure 1B:
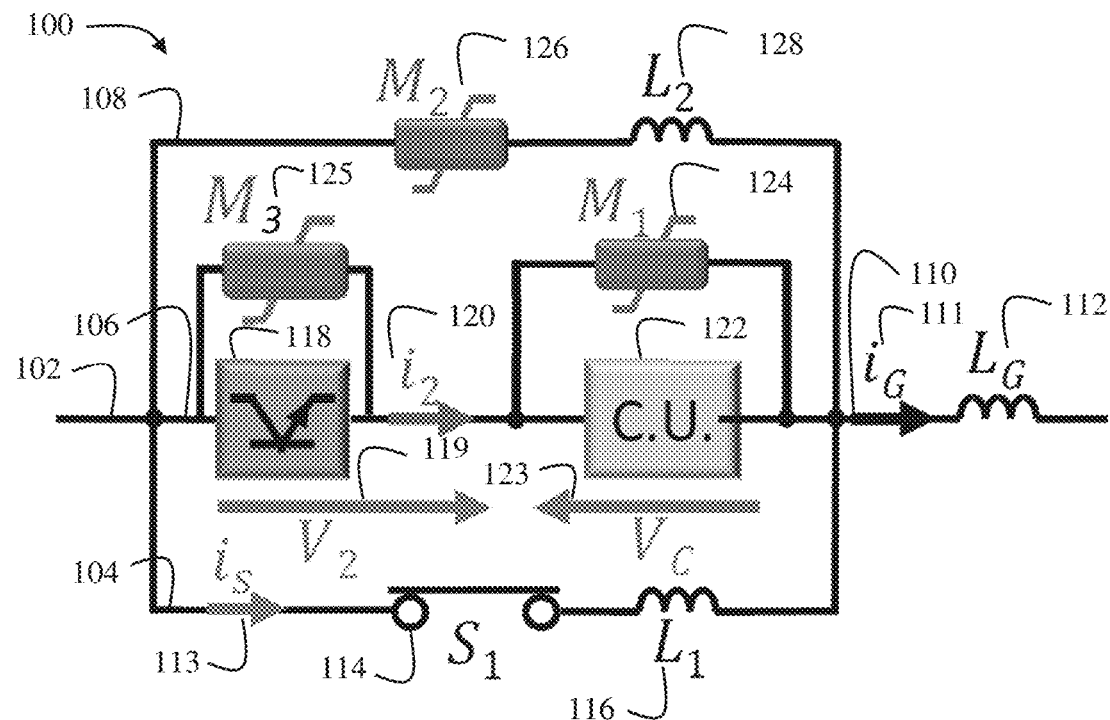
Figure 1C:
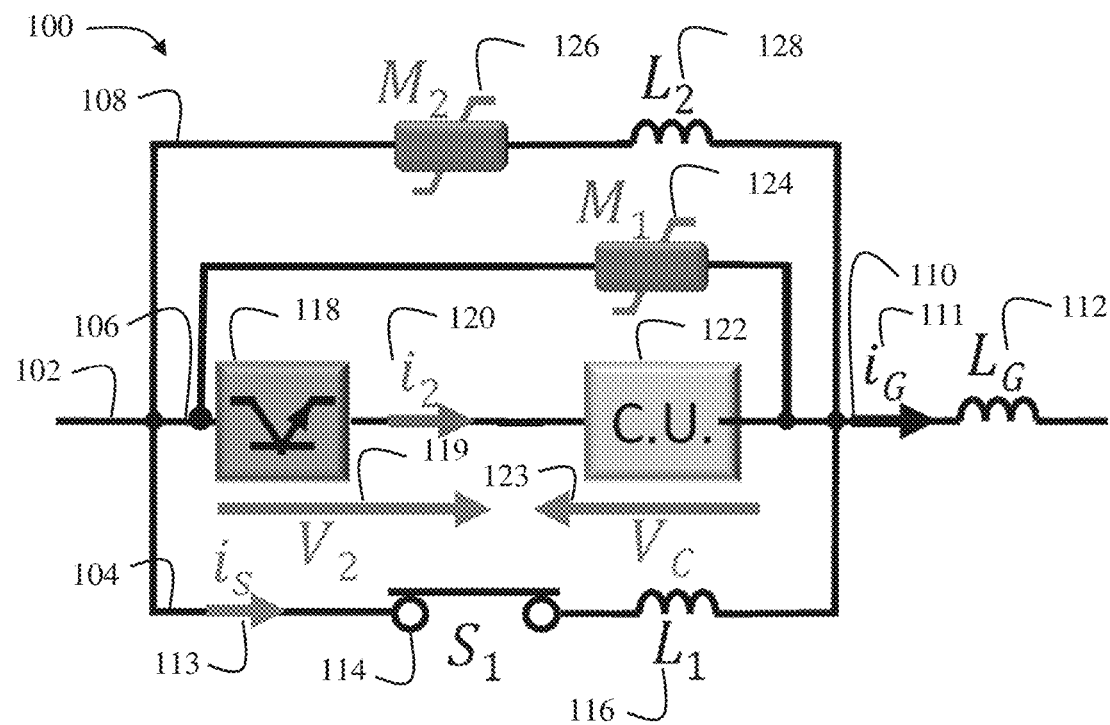

The semiconductor switch path 106 may additionally include a surge arrestor 124, such as a varistor or any other voltage clamping circuit such as a thyristor, connected in parallel to the CU 122. The surge arrestor 124 protects the CU 122 from an over-voltage condition. In some implementations, the surge arrestor 124 may be omitted. In some implementations, an additional surge arrestor 125 may be connected in parallel to the semiconductor switch 118 in addition to the surge arrestor 124, as shown in FIG. 1B. In some implementations, the surge arrestor 124 may be connected in parallel across both the CU 122 and the semiconductor switch 118 as shown in FIG. 1C.

The directions of current and voltages in the example shown in FIG. 1 assumes a load fault, such as a short circuit in the load circuit 112. However, the pending disclosure additionally contemplates source faults, such as a short circuit connected to the input path 102. Implementations of the CU 122 that address source faults in addition to load faults are described in more detail below.

The surge arrester path 108 comprises a surge arrestor 126 configured to absorb residual fault currents in the HCB 100 upon opening the mechanical switch 114 and the semiconductor switch 118. The surge arrestor 126 may be a varistor, such as a metal oxide varistor (MOV), or any other voltage clamping circuit such as a thyristor. An inductor 128 is shown in the surge arrestor path 108 to model the parasitic inductance in the surge arrestor path 108, though an inductor itself is not located in the surge arrestor path 108. While the surge arrestor path 108 is shown as extending across both the semiconductor switch 118 and the CU 122, in some implementations, the surge arrestor path 108 may only extend across the semiconductor switch 118.

Figure 2:
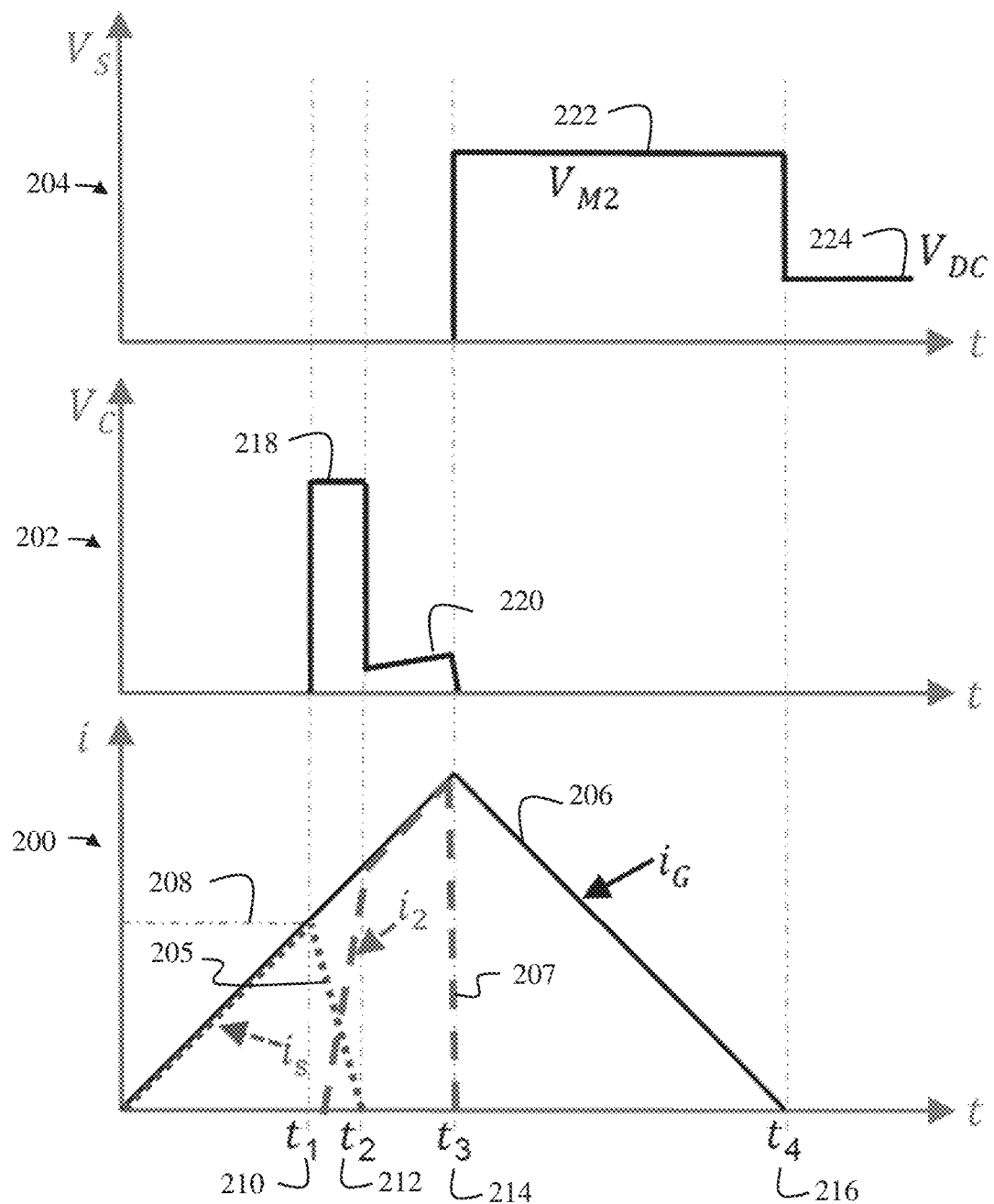
FIG. 2 shows timing diagrams of an operation to open the DC HCB upon detection of an overcurrent suitable for implementing the several embodiments of the disclosure.

FIG. 2 is shows timing diagrams of an operation to open the DC HCB 100 upon detection of an overcurrent. The timing diagrams in FIG. 2 include a current timing diagram 200, a CU voltage diagram 202, and a surge arrestor voltage diagram 204.

As shown in the current timing diagram 200, the output current 111 is represented by a solid line 206, the switch current 113 is represented as a dot-dashed line 205, and the commutation current 120 is represented as a dashed line 207. Upon a load fault, such as a short circuit in the load circuit 112, the switch current 113 will increase until reaching a tripping current 208. The tripping current 208 represents a threshold current value for the switch current 113 for detecting an overcurrent condition. For example, a controller (not shown) may detect that the switch current 113 has reached a value of the tripping current 208. At a first time 210, shown as $t_1$, the semiconductor switch 118 is closed and the CU 122 provides the reverse biased commutation voltage 123 at a first voltage value 218. Between the first time 210 and a second time 212, shown as $t_2$, the switch current 113 is reduced to zero, as shown by the dot-dashed line 205, while the commutation current 120 is increased to the output current 111, as shown by the dashed line 207. The first voltage value 218 drives how fast the output current 111 is commutated from the mechanical switch path 104 to the semiconductor switch path 106. In some implementations, the first voltage value 218 may be set to about 100 V. Other voltage levels for the first voltage value 218 are contemplated by this disclosure.

Between the second time 212 and a third time 214, shown as $t_3$, the CU 122 holds the reversed biased commutation voltage 123 at a second voltage value 220 equal to the voltage drop 119 across the semiconductor switch 118 so as to zero the voltage (e.g., the switch current 113 is maintained at a zero value) across the mechanical switch 114. While the voltage across the mechanical switch 114 is maintained at a zero value, the mechanical switch 114 is opened without current and against no recovery voltage.

Because the output current 111 is steadily increasing between the second time 212 and the third time 214, the voltage drop 119 across the semiconductor switch 118 likewise increases. Therefore, the second voltage value 220 maintained by the CU 122 increases between the second time 212 and the third time 214 to equal a magnitude of the increasing voltage drop 119 across the semiconductor switch 118.

At the third time 214, the mechanical switch 114 has reached its full voltage withstand capability and the semiconductor switch 118 is turned off (opened). At the same time, the CU 122 is also turned off. This causes the voltage across the entire HCB 100 to reach a clamping value 222 of the surge arrestor 126 which in turn forces the output current 111 to ramp down to zero, as shown by the solid line 216. The output current 111 reaches a zero value at a fourth time 216, shown as $t_4$. At the fourth time 216, the HCB 100 is fully open. Following the fourth time 216, the surge arrestor 126 maintains the HCB 100 to have a source voltage value 224 equal to a voltage applied to the input path 102, and zero output current 111.

Figure 3:
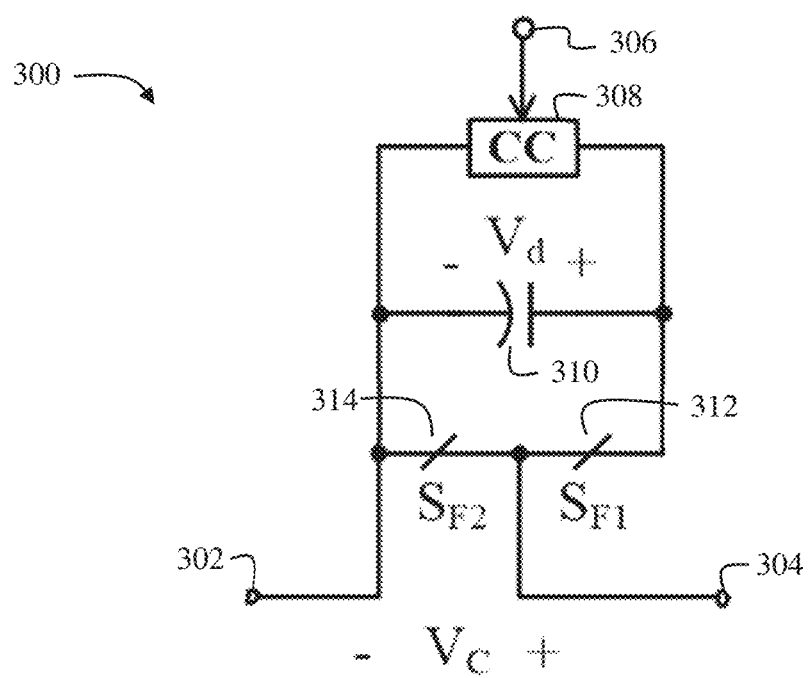
FIG. 3 is a circuit block diagram of a half-bridge voltage source commutation unit suitable for implementing the several embodiments of the disclosure.

FIG. 3 is a circuit block diagram of a half-bridge voltage source commutation unit 300 ("half-bridge CU 300") suitable for implementing the several embodiments of the disclosure. In some implementations, the CU 122 described above may be implemented as the half-bridge CU 300. The half-bridge CU 300 includes a negative terminal 302 and a positive terminal 304 connected in series with the semiconductor switch 118. Following the example shown in FIG. 1, the negative terminal 302 is connected to an output of the semiconductor switch 118 and the positive terminal is connected to the output path 110.

The half-bridge CU 300 also includes a power terminal 306 for supplying power to a charging circuit (CC) 308. The charging circuit 308 is configured to charge a capacitor 310 to the first voltage value 218 for the commutation voltage 123, shown as $V_d$. A negative terminal of the capacitor 310 is connected to the negative terminal 302 of the half-bridge CU 300. A first switch 312, shown as $S_{F1}$, is connected in series with a second switch 314, shown as $S_{F2}$. The first and second switches 312, 314 are semiconductor switches, such as an insulated-gate bipolar transistor (IGBT), a metal-oxide semiconductor field-effect transistor (MOSFET), or a gate turn-off thyristor (GTO). The first and second switches 312, 314 are connected in parallel to the capacitor 310. A first side of the first switch 312 is connected to a positive terminal of the capacitor. A second side of the first switch 312 is connected to the positive terminal 304 of the half-bridge CU 300 and connected to a first side of the second switch 314. A second side of the second switch 314 is connected to the negative terminal of the capacitor 310 and the negative terminal 302 of the half-bridge CU 300.

Figure 4:
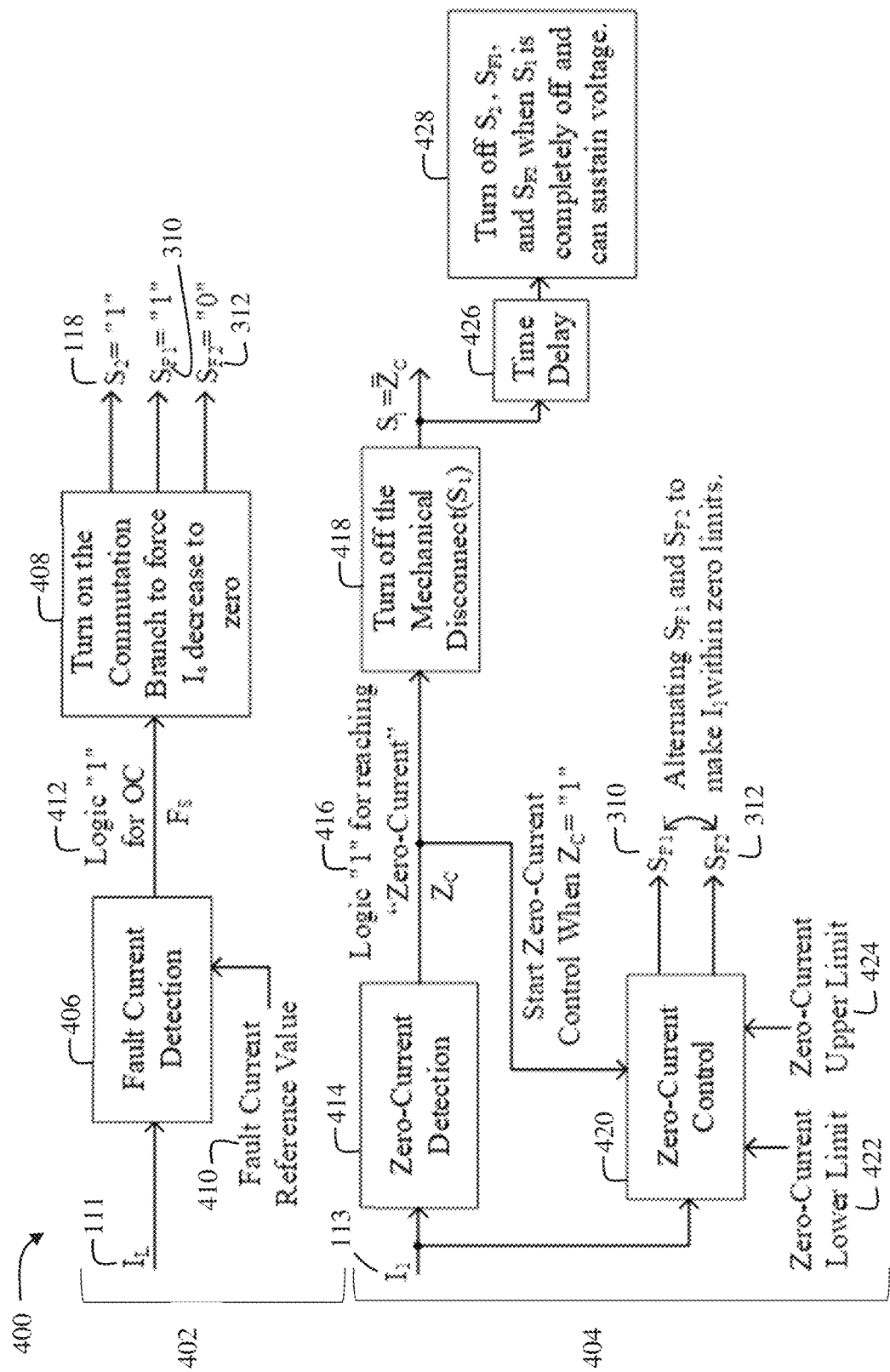
FIG. 4 is a block diagram of a control circuit for controlling operation of the switches in the half-bridge voltage source commutation unit of FIG. 3.

FIG. 4 is a control circuit block diagram 400 for controlling operation of the switches 312, 314 in the half-bridge CU 300 of FIG. 3. The control circuit block diagram 400 includes a fault detection control branch 402 and a breaker opening control branch 404. The fault detection control branch 402 comprises a fault detection circuit 406 and a commutation control block 408. The fault detection circuit 406 is configured to compare the output current 111 from the HCB 100 to a fault current reference value 410. For example, the fault current reference value 410 may be equal to the tripping current 208 discussed above. Upon the fault detection circuit 406 determining that the output current 111 is equal to or greater than the fault current reference value 410, the fault detection circuit 406 outputs an overcurrent condition signal 412 (e.g., a logic "1" value in the example shown in FIG. 4) to the commutation control block 408.

Upon receiving the overcurrent condition signal 412, the commutation control block 408 turns on the semiconductor switch 118 and the CU 122 to force the switch current 113 to decrease to zero. The commutation control block 408 outputs a first control signal to turn on the semiconductor switch 118 (e.g., a logic "1" value). The commutation control block 408 outputs a second control signal to turn on the first switch 312 of the half-bridge CU 300 (e.g., a logic "1" value). The commutation control block 408 outputs a third control signal to turn off the second switch 314 of the half-bridge CU 300 (e.g., a logic "0" value). With this configuration of the first and second switches 312, 314, the positive terminal of the capacitor 310 is connected to the positive terminal 304 and the negative terminal of the capacitor 310 is connected to the negative terminal 302 of the half-bridge CU 300. Therefore, the value of the commutation voltage 123 is equal to the first voltage value 218 charged on the capacitor 310.

The breaker opening control branch 404 comprises a zero-current detection circuit 414 that monitors the switch current 113. Upon the switch current 113 reaching a zero value, the zero-current detection circuit 414 outputs a zero-current condition signal 416. The zero-current condition signal 416 triggers a mechanical switch control block 418 and a zero-current control block 420. Upon receiving the zero-current condition signal 416, the mechanical switch control block 418 outputs a control signal to control the mechanical switch 114 to open.

Upon receiving the zero-condition control signal 416, the zero-current control block 420 operates the half-bridge CU 300 to maintain the zero-current condition for the switch current 113 on the mechanical switch path 104. The zero-current control block 420 detects and compares a current value of the switch current 113 to a lower limit current value 422 and an upper limit current value 424. Upon determining that the switch current 113 is equal to the lower limit current value 422, the zero-current control block 420 toggles the control signals supplied to the switches 312, 314 of the half-bridge CU 300.

Upon determining that the switch current 113 is equal to the lower limit current value 422, the zero-current control block 420 outputs a first control signal to turn off the first switch 312 of the half-bridge CU 300 (e.g., a logic "0" value). The zero-current control block 420 outputs a second control signal to turn on the second switch 314 of the half-bridge CU 300 (e.g., a logic "1" value). With this configuration of the first and second switches 312, 314, the positive terminal 304 and the negative terminal 302 of the half-bridge CU 300 are connected to each other (e.g., short circuit across the CU 122). Therefore, a small amount of current will begin to accumulate in the switch current 113.

Upon determining that the switch current 113 is equal to the upper limit current value 424, the zero-current control block 420 again toggles the control signals supplied to the switches 312, 314 of the half-bridge CU 300. The zero-current control block 420 outputs a first control signal to turn on the first switch 312 of the half-bridge CU 300 (e.g., a logic "1" value). The zero-current control block 420 outputs a second control signal to turn off the second switch 314 of the half-bridge CU 300 (e.g., a logic "0" value). With this configuration of the first and second switches 312, 314, the positive terminal of the capacitor 310 is connected to the positive terminal 304 and the negative terminal of the capacitor 310 is connected to the negative terminal 302 of the half-bridge CU 300.

In response to the mechanical switch control block 418 outputting the control signal to control the mechanical switch 114 to open, a time delay control block 426 ensures that sufficient time has elapsed for the mechanical switch 114 to reach its full voltage withstand capability. After the time delay, the time delay control block 426 outputs a control signal to a shut-off control block 428. The shut-off control block 428 outputs control signals to turn off the semiconductor switch 118 and the switches 312, 314 of the half-bridge CU 300.

Figure 5:
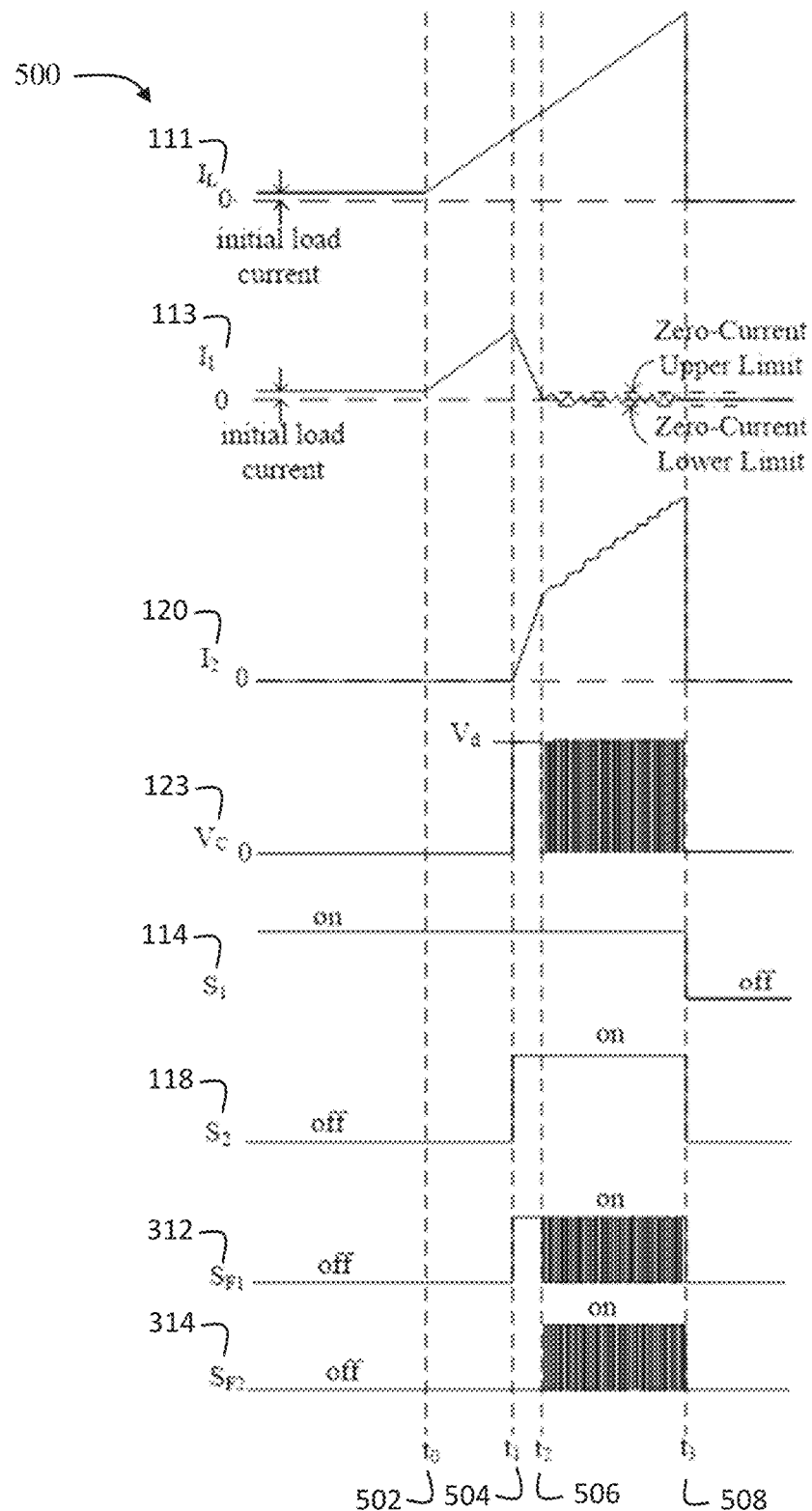
FIG. 5 shows timing diagrams of an operation to open the DC HCB using the half-bridge voltage source commutation unit of FIG. 3.

FIG. 5 shows timing diagrams of an operation to open the DC HCB 100 using the half-bridge CU 300. At a first time 502, shown as $t_0$, a load fault, such as a short circuit, initiates a rapid increase in the output current 111 of the HCB 100. The mechanical switch 114 is closed at the first time 502 to carry current from the input path 102 to the output path 110. At a second time 504, shown as $t_1$, the fault detection circuit 406 detects an over-current condition and the commutation control block 408 outputs control signals to turn on the semiconductor switch 118 and the first switch 312 of the half-bridge CU 300. Accordingly, the output current 111 is commutated from the mechanical switch path 104 to the semiconductor switch path 106.

At a third time 506, shown as $t_2$, the zero-current detection circuit 414 detects a zero-current condition on the switch current 113. The mechanical switch control block 418 outputs a control signal to control the mechanical switch 114 to open. The time delay circuit 426 waits until a fourth time 508, shown as $t_3$, to output a control signal to a shut-off control block 428. In the meantime, between the third time 506 and the fourth time 508, the zero-current control block 420 repeatedly toggles the control signals to the first and second switches 312, 314 of the half-bridge CU 300 to maintain the switch current 113 at a value between the lower limit current value 422 and the upper limit current value 424. At the fourth time 508, the mechanical switch 114 is open and the shut-off control block 428 outputs control signals to turn off all of the semiconductor switch 118 and the first and second switches 312, 314 of the half-bridge CU 300.

Figure 6:
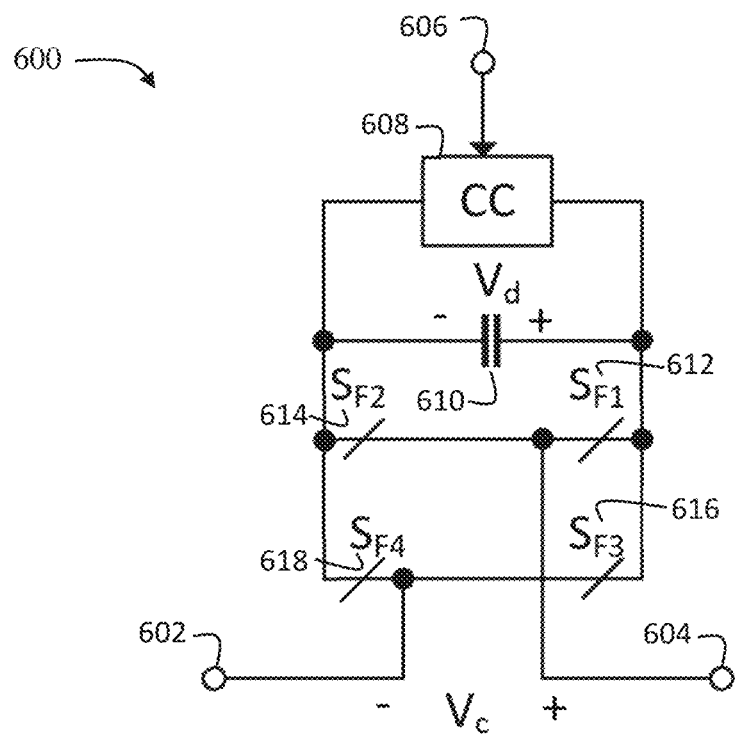
FIG. 6 is a circuit block diagram of a full bridge voltage source commutation unit suitable for implementing the several embodiments of the disclosure.

FIG. 6 is a circuit block diagram of a full bridge voltage source commutation unit 600 ("full bridge CU 600") suitable for implementing the several embodiments of the disclosure. In some implementations, the CU 122 described above may be implemented as the full bridge CU 600. The full-bridge CU 600 includes a negative terminal 602 and a positive terminal 604 connected in series with the semiconductor switch 118. Following the example shown in FIG. 1, the negative terminal 602 is connected to an output of the semiconductor switch 118 and the positive terminal 604 is connected to the output path 110.

The full bridge CU 600 also includes a power terminal 606 for supplying power to a charging circuit (CC) 608. The charging circuit 608 is configured to charge a capacitor 610 to the first voltage value 218 for the commutation voltage 123, shown as $V_d$. A first switch 612, shown as $S_{F1}$, is connected in series with a second switch 614, shown as $S_{F2}$. The first and second switches 612, 614 are connected in parallel to the capacitor 610. A third switch 616, shown as $S_{F3}$, is connected in series with a fourth switch 618, shown as $S_{F4}$. The third and fourth switches 616, 618 are connected in parallel to the capacitor 610 and connected in parallel to the first and second switches 612, 614. The first, second, third, and fourth switches 612, 614, 616, 618 are semiconductor switches, such as an IGBT, a MOSFET, or a GTO.

A first side of the first switch 612 is connected to a positive terminal of the capacitor. A second side of the first switch 612 is connected to the positive terminal 604 of the full bridge CU 600 and connected to a first side of the second switch 614. A second side of the second switch 614 is connected to the negative terminal of the capacitor 610. A first side of the third switch 616 is connected to the positive terminal of the capacitor 610 and the first side of the first switch 612. A second side of the third switch 616 is connected to the negative terminal 602 of the full bridge CU 600 and connected to a first side of the fourth switch 618. A second side of the fourth switch 618 is connected to the negative terminal of the capacitor 610 and connected to the second side of the second switch 614.

The full bridge CU 600 operates largely the same as the half-bridge CU 300, but controls for both source and load faults. Upon detection of a load overcurrent condition, the commutation control block 408 outputs a first control signal to turn off the third switch 616 (e.g., a logic "0" value). The commutation control block 408 outputs a second control signal to turn on the fourth switch 618 (e.g., a logic "1" value). The commutation control block 408 further output control signals to the first and second switches 612, 614 in the same manner as described above for the first and second switches 312, 314. With this configuration of the first, second, third and fourth switches 612, 614, 616, 618, the positive terminal of the capacitor 610 is connected to the positive terminal 604 and the negative terminal of the capacitor 610 is connected to the negative terminal 602 of the full bridge CU 600. Likewise, the zero-current control block 420 outputs control signals to toggle the state of the first and second switches 612, 614 in the same manner as described above for the first and second switches 312, 314 while maintaining the state of the third and fourth switches 616, 618 (e.g., in the off and on states respectively).

Upon detection of a source overcurrent condition, the commutation control block 508 outputs a first control signal to turn off the first switch 612 (e.g., a logic "0" value). The commutation control block 408 outputs a second control signal to turn on the second switch 614 (e.g., a logic "1" value). The commutation control block 408 outputs a third control signal to turn on the third switch 616 (e.g., a logic "1" value). The commutation control block 408 outputs a fourth control signal to turn off the fourth switch 618 (e.g., a logic "0" value). With this configuration of the first, second, third and fourth switches 612, 614, 616, 618, the positive terminal of the capacitor 610 is connected to the negative terminal 602 and the negative terminal of the capacitor 610 is connected to the positive terminal 604 of the full bridge CU 600. In other words, the direction of the commutation voltage 123 is opposite from that when a load fault is detected. The zero-current control block 420 outputs control signals to toggle the state of the third and fourth switches 616, 618 in the same manner as described above for the first and second switches 312, 314 while maintaining the state of the first and second switches 612, 614 (e.g., in the off and on states respectively).

Figure 7:
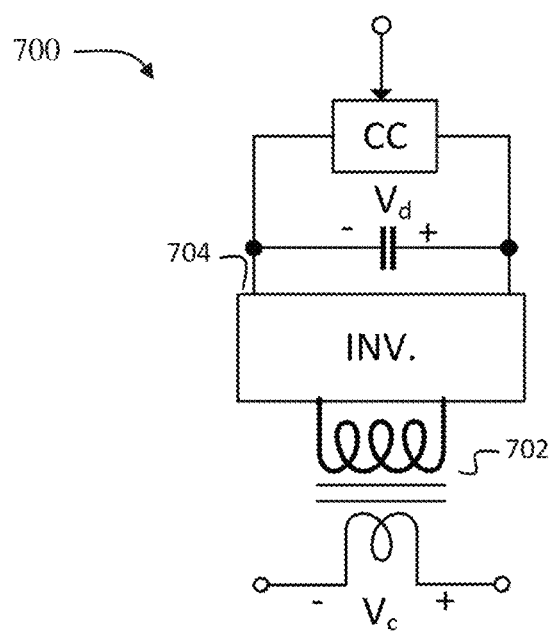
FIG. 7 is a circuit block diagram of a transformer voltage source commutation unit suitable for implementing the several embodiments of the disclosure.

FIG. 7 is a circuit block diagram of a transformer voltage source commutation unit 700 ("transformer CU 700") suitable for implementing the several embodiments of the disclosure. The transformer CU 700 allows for a higher voltage, but lower current commutation unit relative to the CU 300 and CU 600 by providing the commutation voltage 123 using a transformer 702 with an inverter circuit 704.

Figure 8:
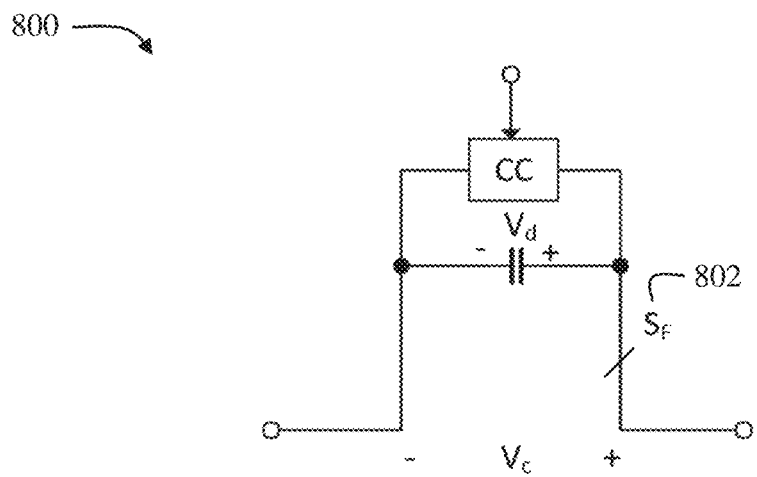
FIG. 8 is a circuit block diagram of a single-switch voltage source commutation unit suitable for implementing the several embodiments of the disclosure.
Figure 9:
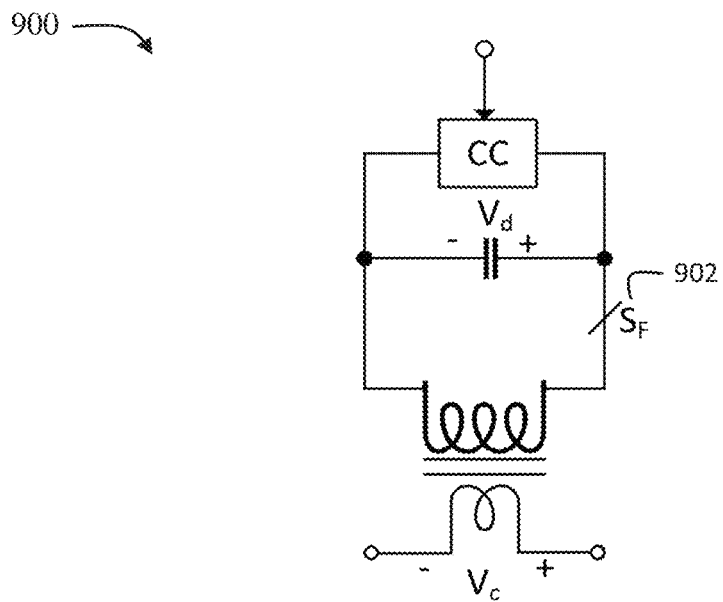
FIG. 9 is a circuit block diagram of a single-switch transformer voltage source commutation unit suitable for implementing the several embodiments of the disclosure.

FIG. 8 is a circuit block diagram of a single-switch voltage source commutation unit 800 ("single-switch CU 800") suitable for implementing the several embodiments of the disclosure. FIG. 9 is a circuit block diagram of a single-switch transformer voltage source commutation unit 900 (single-switch transformer CU 900") suitable for implementing the several embodiments of the disclosure. The single-switch CUs 800, 900 are used in situations where the mechanical switch 114 is designed to be opened in the presence of small currents.

It should be appreciated that the logical operations described herein with respect to the various figures may be implemented (1) as a sequence of computer implemented acts or program modules (i.e., software) running on a computing device (e.g., the computing device described in FIG. 9), (2) as interconnected machine logic circuits or circuit modules (i.e., hardware) within the computing device and/or (3) a combination of software and hardware of the computing device. Thus, the logical operations discussed herein are not limited to any specific combination of hardware and software. The implementation is a matter of choice dependent on the performance and other requirements of the computing device. Accordingly, the logical operations described herein are referred to variously as operations, structural devices, acts, or modules. These operations, structural devices, acts and modules may be implemented in software, in firmware, in special purpose digital logic, and any combination thereof. It should also be appreciated that more or fewer operations may be performed than shown in the figures and described herein. These operations may also be performed in a different order than those described herein.

Figure 10:
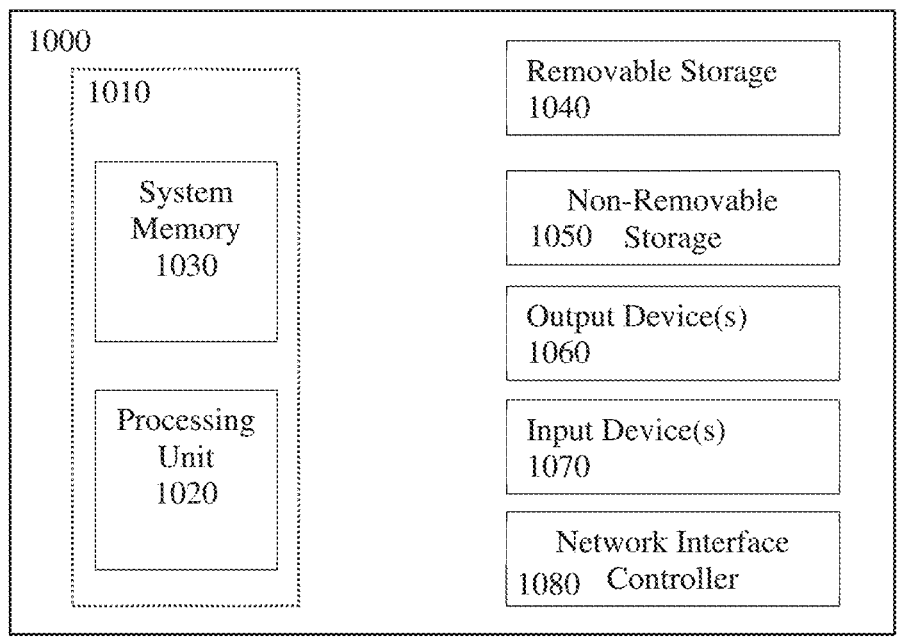
FIG. 10 is an exemplary computer system suitable for implementing the several embodiments of the disclosure.

Referring to FIG. 10, an example computing device 1000 upon which embodiments of the invention may be implemented is illustrated. For example, the controller system or one or more of the controller blocks described herein may each be implemented as a computing device, such as computing device 1000. It should be understood that the example computing device 1000 is only one example of a suitable computing environment upon which embodiments of the invention may be implemented. Optionally, the computing device 1000 can be a well-known computing system including, but not limited to, personal computers, servers, handheld or laptop devices, multiprocessor systems, microprocessor-based systems, network personal computers (PCs), minicomputers, mainframe computers, embedded systems, and/or distributed computing environments including a plurality of any of the above systems or devices. Distributed computing environments enable remote computing devices, which are connected to a communication network or other data transmission medium, to perform various tasks. In the distributed computing environment, the program modules, applications, and other data may be stored on local and/or remote computer storage media.

In an embodiment, the computing device 1000 may comprise two or more computers in communication with each other that collaborate to perform a task. For example, but not by way of limitation, an application may be partitioned in such a way as to permit concurrent and/or parallel processing of the instructions of the application. Alternatively, the data processed by the application may be partitioned in such a way as to permit concurrent and/or parallel processing of different portions of a data set by the two or more computers. In an embodiment, virtualization software may be employed by the computing device 1000 to provide the functionality of a number of servers that is not directly bound to the number of computers in the computing device 1000. For example, virtualization software may provide twenty virtual servers on four physical computers. In an embodiment, the functionality disclosed above may be provided by executing the application and/or applications in a cloud computing environment. Cloud computing may comprise providing computing services via a network connection using dynamically scalable computing resources. Cloud computing may be supported, at least in part, by virtualization software. A cloud computing environment may be established by an enterprise and/or may be hired on an as-needed basis from a third party provider. Some cloud computing environments may comprise cloud computing resources owned and operated by the enterprise as well as cloud computing resources hired and/or leased from a third party provider.

In its most basic configuration, computing device 1000 typically includes at least one processing unit 1020 and system memory 1030. Depending on the exact configuration and type of computing device, system memory 1030 may be volatile (such as random access memory (RAM)), non-volatile (such as read-only memory (ROM), flash memory, etc.), or some combination of the two. This most basic configuration is illustrated in FIG. 10 by dashed line 1010. The processing unit 1020 may be a standard programmable processor that performs arithmetic and logic operations necessary for operation of the computing device 1000. While only one processing unit 1020 is shown, multiple processors may be present. Thus, while instructions may be discussed as executed by a processor, the instructions may be executed simultaneously, serially, or otherwise executed by one or multiple processors. The computing device 1000 may also include a bus or other communication mechanism for communicating information among various components of the computing device 1000.

Computing device 1000 may have additional features/functionality. For example, computing device 1000 may include additional storage such as removable storage 1040 and non-removable storage 1050 including, but not limited to, magnetic or optical disks or tapes. Computing device 1000 may also contain network connection(s) 1080 that allow the device to communicate with other devices such as over the communication pathways described herein. The network connection(s) 1080 may take the form of modems, modem banks, Ethernet cards, universal serial bus (USB) interface cards, serial interfaces, token ring cards, fiber distributed data interface (FDDI) cards, wireless local area network (WLAN) cards, radio transceiver cards such as code division multiple access (CDMA), global system for mobile communications (GSM), long-term evolution (LTE), worldwide interoperability for microwave access (WiMAX), and/or other air interface protocol radio transceiver cards, and other well-known network devices. Computing device 1000 may also have input device(s) 1070 such as a keyboards, keypads, switches, dials, mice, track balls, touch screens, voice recognizers, card readers, paper tape readers, or other well-known input devices. Output device(s) 1060 such as a printers, video monitors, liquid crystal displays (LCDs), touch screen displays, displays, speakers, etc. may also be included. The additional devices may be connected to the bus in order to facilitate communication of data among the components of the computing device 1000. All these devices are well known in the art and need not be discussed at length here.

The processing unit 1020 may be configured to execute program code encoded in tangible, computer-readable media. Tangible, computer-readable media refers to any media that is capable of providing data that causes the computing device 1000 (i.e., a machine) to operate in a particular fashion. Various computer-readable media may be utilized to provide instructions to the processing unit 1020 for execution. Example tangible, computer-readable media may include, but is not limited to, volatile media, non-volatile media, removable media and non-removable media implemented in any method or technology for storage of information such as computer readable instructions, data structures, program modules or other data. System memory 1030, removable storage 1040, and non-removable storage 1050 are all examples of tangible, computer storage media. Example tangible, computer-readable recording media include, but are not limited to, an integrated circuit (e.g., field-programmable gate array or application-specific IC), a hard disk, an optical disk, a magneto-optical disk, a floppy disk, a magnetic tape, a holographic storage medium, a solid-state device, RAM, ROM, electrically erasable program read-only memory (EEPROM), flash memory or other memory technology, CD-ROM, digital versatile disks (DVD) or other optical storage, magnetic cassettes, magnetic tape, magnetic disk storage or other magnetic storage devices.

It is fundamental to the electrical engineering and software engineering arts that functionality that can be implemented by loading executable software into a computer can be converted to a hardware implementation by well-known design rules. Decisions between implementing a concept in software versus hardware typically hinge on considerations of stability of the design and numbers of units to be produced rather than any issues involved in translating from the software domain to the hardware domain. Generally, a design that is still subject to frequent change may be preferred to be implemented in software, because re-spinning a hardware implementation is more expensive than re-spinning a software design. Generally, a design that is stable that will be produced in large volume may be preferred to be implemented in hardware, for example in an application specific integrated circuit (ASIC), because for large production runs the hardware implementation may be less expensive than the software implementation. Often a design may be developed and tested in a software form and later transformed, by well-known design rules, to an equivalent hardware implementation in an application specific integrated circuit that hardwires the instructions of the software. In the same manner as a machine controlled by a new ASIC is a particular machine or apparatus, likewise a computer that has been programmed and/or loaded with executable instructions may be viewed as a particular machine or apparatus.

In an example implementation, the processing unit 1020 may execute program code stored in the system memory 1030. For example, the bus may carry data to the system memory 1030, from which the processing unit 1020 receives and executes instructions. The data received by the system memory 1030 may optionally be stored on the removable storage 1040 or the non-removable storage 1050 before or after execution by the processing unit 1020.

It should be understood that the various techniques described herein may be implemented in connection with hardware or software or, where appropriate, with a combination thereof. Thus, the methods and apparatuses of the presently disclosed subject matter, or certain aspects or portions thereof, may take the form of program code (i.e., instructions) embodied in tangible media, such as floppy diskettes, CD-ROMs, hard drives, or any other machine-readable storage medium wherein, when the program code is loaded into and executed by a machine, such as a computing device, the machine becomes an apparatus for practicing the presently disclosed subject matter. In the case of program code execution on programmable computers, the computing device generally includes a processor, a storage medium readable by the processor (including volatile and non-volatile memory and/or storage elements), at least one input device, and at least one output device. One or more programs may implement or utilize the processes described in connection with the presently disclosed subject matter, e.g., through the use of an application programming interface (API), reusable controls, or the like. Such programs may be implemented in a high level procedural or object-oriented programming language to communicate with a computer system. However, the program(s) can be implemented in assembly or machine language, if desired. In any case, the language may be a compiled or interpreted language and it may be combined with hardware implementations.

Embodiments of the methods and systems may be described herein with reference to block diagrams and flowchart illustrations of methods, systems, apparatuses and computer program products. It will be understood that each block of the block diagrams and flowchart illustrations, and combinations of blocks in the block diagrams and flowchart illustrations, respectively, can be implemented by computer program instructions. These computer program instructions may be loaded onto a general purpose computer, special purpose computer, or other programmable data processing apparatus to produce a machine, such that the instructions which execute on the computer or other programmable data processing apparatus create a means for implementing the functions specified in the flowchart block or blocks.

These computer program instructions may also be stored in a computer-readable memory that can direct a computer or other programmable data processing apparatus to function in a particular manner, such that the instructions stored in the computer-readable memory produce an article of manufacture including computer-readable instructions for implementing the function specified in the flowchart block or blocks. The computer program instructions may also be loaded onto a computer or other programmable data processing apparatus to cause a series of operational steps to be performed on the computer or other programmable apparatus to produce a computer-implemented process such that the instructions that execute on the computer or other programmable apparatus provide steps for implementing the functions specified in the flowchart block or blocks.

Accordingly, blocks of the block diagrams and flowchart illustrations support combinations of means for performing the specified functions, combinations of steps for performing the specified functions and program instruction means for performing the specified functions. It will also be understood that each block of the block diagrams and flowchart illustrations, and combinations of blocks in the block diagrams and flowchart illustrations, can be implemented by special purpose hardware-based computer systems that perform the specified functions or steps, or combinations of special purpose hardware and computer instructions.

While several embodiments have been provided in the present disclosure, it should be understood that the disclosed systems and methods may be embodied in many other specific forms without departing from the spirit or scope of the present disclosure. The present examples are to be considered as illustrative and not restrictive, and the intention is not to be limited to the details given herein. For example, the various elements or components may be combined or integrated in another system or certain features may be omitted or not implemented.

Also, techniques, systems, subsystems, and methods described and illustrated in the various embodiments as discrete or separate may be combined or integrated with other systems, modules, techniques, or methods without departing from the scope of the present disclosure. Other items shown or discussed as directly coupled or communicating with each other may be indirectly coupled or communicating through some interface, device, or intermediate component, whether electrically, mechanically, or otherwise. Other examples of changes, substitutions, and alterations are ascertainable by one skilled in the art and could be made without departing from the spirit and scope disclosed herein.

What is claimed is:

1. A direct current (DC) hybrid circuit breaker (HCB), comprising:
   an input;
   an output;
   a mechanical switch path comprising a mechanical switch, wherein the mechanical switch path is coupled between the input and the output;
   a semiconductor switch path comprising a semiconductor switch connected in series with a commutation unit configured to supply a reverse biased voltage source on the semiconductor switch path, wherein the semiconductor switch path is coupled between the input and the output in parallel to the mechanical switch path;
   a surge arrestor path comprising a surge arrestor, wherein the surge arrestor path is coupled between the input and the output in parallel to the mechanical switch path and the semiconductor switch path or the surge arrestor path is coupled in parallel across the semiconductor switch; and
   a second surge arrestor coupled in parallel across the semiconductor switch, the commutation unit, or both the semiconductor switch and the commutation unit.

2. The DC HCB of claim 1, wherein the surge arrestor is configured to absorb residual fault currents in the DC HBC upon the mechanical switch and the semiconductor switch being opened.

3. The DC HCB of claim 1, wherein the second surge arrestor is coupled in parallel across the commutation unit, further comprising:
   a third surge arrestor coupled in parallel across the semiconductor switch.

4. The DC HCB of claim 1, wherein the second surge arrestor is included in the semiconductor switch path.

5. The DC HCB of claim 1, wherein the second surge arrestor is configured to protect the commutation unit from an over-voltage condition.

6. The DC HCB of claim 1, wherein the surge arrestor or the second surge arrestor is a varistor, metal oxide varistor, thyristor, or any other voltage clamping circuit.

7. The DC HCB of claim 1, wherein the commutation unit comprises a transformer and an inverter connected in parallel with a capacitor.

8. The DC HCB of claim 1, wherein the commutation unit comprises:
   a capacitor;
   an input of the commutation unit;
   an output of the commutation unit;
   a first switch, where a first side of the first switch is coupled to a positive terminal of the capacitor.

9. The DC HCB of claim 8, wherein the input of the commutation unit is coupled to a negative terminal of the capacitor and a second side of the first switch is coupled to the output of the commutation unit.

10. The DC HCB of claim 8, wherein the second side of the first switch is coupled to a first side of a first winding of the transformer, a second side of the first winding of the transformer is coupled to a negative terminal of the capacitor, the output of the commutation unit is coupled to the first side of a second winding of the transformer, and the input of the commutation unit is coupled to the second side of the second winding of the transformer.

11. The DC HCB of claim 1, wherein the commutation unit comprises:
   a capacitor;
   an input of the commutation unit, where the input of the commutation unit is coupled to a negative terminal of the capacitor;
   an output of the commutation unit;
   a first switch, where a first side of the first switch is coupled to a positive terminal of the capacitor;
   a second switch, where a first side of the second switch is coupled to a second side of the first switch and is coupled to the output of the commutation unit, and where a second side of the second switch is coupled to the input of the commutation unit and the negative terminal of the capacitor.

12. The DC HCB of claim 1, wherein the commutation unit comprises:
   a capacitor;
   an input of the commutation unit;
   an output of the commutation unit;
   a first switch, where a first side of the first switch is coupled to a positive terminal of the capacitor;
   a second switch, where a first side of the second switch is coupled to a second side of the first switch and the output of the commutation unit, and where a second side of the second switch is coupled to a negative terminal of the capacitor;
   a third switch, where a first side of the third switch is coupled to the positive terminal of the capacitor and the first side of the first switch; and
   a fourth switch, where a first side of the fourth switch is coupled to a second side of the third switch and the input of the commutation unit, and where a second side of the fourth switch is coupled to the negative terminal of the capacitor and the second side of the second switch.

13. A direct current (DC) hybrid circuit breaker (HCB), comprising:
   an input;
   an output;
   a mechanical switch path comprising a mechanical switch, wherein the mechanical switch path is coupled between the input and the output;
   a semiconductor switch path comprising a semiconductor switch connected in series with a commutation unit configured to supply a reverse biased voltage source on the semiconductor switch path, wherein the semiconductor switch path is coupled between the input and the output in parallel to the mechanical switch path, wherein the commutation unit comprises:
   a capacitor;
   an input of the commutation unit, where the input of the commutation unit is coupled to a negative terminal of the capacitor;
   an output of the commutation unit;
   a first switch, where a first side of the first switch is coupled to a positive terminal of the capacitor;
   a second switch, where a first side of the second switch is coupled to a second side of the first switch and is coupled to the output of the commutation unit, and where a second side of the second switch is coupled to the input of the commutation unit and the negative terminal of the capacitor.

14. A direct current (DC) hybrid circuit breaker (HCB), comprising:
an input;
an output;
a mechanical switch path comprising a mechanical switch, wherein the mechanical switch path is coupled between the input and the output;
a semiconductor switch path comprising a semiconductor switch connected in series with a commutation unit configured to supply a reverse biased voltage source on the semiconductor switch path, wherein the semiconductor switch path is coupled between the input and the output in parallel to the mechanical switch path, wherein the commutation unit comprises:
a capacitor;
an input of the commutation unit;
an output of the commutation unit;
a first switch, where a first side of the first switch is coupled to a positive terminal of the capacitor;
a second switch, where a first side of the second switch is coupled to a second side of the first switch and the output of the commutation unit, and where a second side of the second switch is coupled to a negative terminal of the capacitor;
a third switch, where a first side of the third switch is coupled to the positive terminal of the capacitor and the first side of the first switch;
a fourth switch, where a first side of the fourth switch is coupled to a second side of the third switch and the input of the commutation unit, and where a second side of the fourth switch is coupled to the negative terminal of the capacitor and the second side of the second switch.

15. A method of operating a direct current (DC) hybrid circuit breaker (HCB), the method comprising:
detecting an over-current condition in a switch current across a closed mechanical switch in a mechanical switch path of the DC HCB;
in response to detecting the over-current condition, closing a semiconductor switch and providing a reverse biased commutation voltage by a commutation unit, wherein the semiconductor switch and the commutation unit are connected in series across a semiconductor switch path of the DC HCB and the semiconductor switch path is coupled in parallel to the mechanical switch path;
detecting that the switch current reaches a zero-current condition and responsively opening the mechanical switch;
maintaining the zero-current condition in the switch current for a predetermined period of time; and
after the predetermined period of time, opening the semiconductor switch and turning off the commutation unit.

16. A method of operating a direct current (DC) hybrid circuit breaker (HCB), the method comprising:
detecting an over-current condition in a switch current across a closed mechanical switch in a mechanical switch path of the DC HCB;
in response to detecting the over-current condition, closing a semiconductor switch and providing a reverse biased commutation voltage by a commutation unit, wherein the semiconductor switch and the commutation unit are connected in series across a semiconductor switch path of the DC HCB and the semiconductor switch path is coupled in parallel to the mechanical switch path;
detecting that the switch current reaches a zero-current condition and responsively opening the mechanical switch; and
maintaining the zero-current condition in the switch current for a predetermined period of time, wherein the commutation unit comprises a capacitor, a first switch, and a second switch, wherein the first switch is coupled between a positive terminal of the capacitor and a positive terminal of the commutation unit, the second switch is coupled between the positive terminal of the commutation unit and a negative terminal of the commutation unit, and a negative terminal of the capacitor is coupled to the negative terminal of the commutation unit.

17. The method of operating the DC HCB of claim 16, wherein providing a reverse biased commutation voltage by the commutation unit comprises closing the first switch and opening the second switch.

18. The method of operating the DC HCB of claim 17, wherein maintaining the zero-current condition in the switch current comprises repeatedly toggling the first switch and the second switch to maintain the switch current between an upper limit current and a lower limit current.

* * * * *